(12) United States Patent
Shibata (10) Patent No.: US 7,057,204 B2
(45) Date of Patent: Jun. 6, 2006

(54) III–V GROUP NITRIDE SYSTEM SEMICONDUCTOR SUBSTRATE

(75) Inventor: Masatomo Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 149 days.

(21) Appl. No.: 10/752,092

(22) Filed: Jan. 7, 2004

(65) Prior Publication Data

US 2005/0093003 A1    May 5, 2005

(30) Foreign Application Priority Data

Oct. 29, 2003  (JP)  ............................. 2003-368828

(51) Int. Cl.
*H01L 29/06* (2006.01)
*H01L 29/12* (2006.01)

(52) U.S. Cl. ...................................... 257/11

(58) Field of Classification Search ................ 438/460, 438/689; 257/11–12
See application file for complete search history.

(56) References Cited

U.S. PATENT DOCUMENTS

| | | | |
|---|---|---|---|
| 5,290,393 | A | 3/1994 | Nakamura |
| 6,348,096 | B1 | 2/2002 | Sunakawa et al. |
| 6,413,627 | B1 | 7/2002 | Motoki et al. |
| 6,555,845 | B1 | 4/2003 | Sunakawa et al. |
| 2002/0028564 | A1* | 3/2002 | Motoki et al. .............. 438/460 |
| 2002/0066403 | A1 | 6/2002 | Sunakawa et al. |
| 2002/0197825 | A1 | 12/2002 | Usui et al. |
| 2003/0080345 | A1 | 5/2003 | Motoki et al. |

FOREIGN PATENT DOCUMENTS

| | | | |
|---|---|---|---|
| JP | 4-297023 | A | 10/1992 |
| JP | 10-312971 | A | 11/1998 |
| JP | 11-251253 | A | 9/1999 |
| JP | 2000-22212 | A | 1/2000 |
| JP | 2003-165799 | A | 6/2003 |
| JP | 2003-178984 | A | 6/2003 |

OTHER PUBLICATIONS

O. Nam et al., "Lateral epitaxy of low defect density GaN layers via organometallic vapor phase epitaxy", Applied Physics Letters, vol. 71, No. 18, Nov. 3, 1997, pp. 2638-2640.

M. Kuramoto et al., "Room-Temperature Continuous-Wave Operation of InGaN Multi-Quantum-Well Laser Diodes Grown on an n-GaN Substrate with a Backside n-Contact", Jpn. J. Appl. Phys., vol. 38, Part 2, No. 2B, Feb. 15, 1999, pp. L184-L186.

(Continued)

*Primary Examiner*—David S. Blum
(74) *Attorney, Agent, or Firm*—Foley & Lardner LLP (57) ABSTRACT

A III–V group nitride system semiconductor substrate has III–V group nitride system single crystal grown on a hetero-substrate. The III–V group nitride system semiconductor substrate has a flat surface and satisfies the relationship of $\theta > \alpha$, where $\theta$ [deg] is given as an average in angles of the substrate surface to low index surfaces closest to the substrate surface measured at a plurality of arbitrary points in plane of the substrate, and a variation range of the measured angles to $\theta$ is represented by $\pm \alpha$ [deg].

14 Claims, 4 Drawing Sheets

OTHER PUBLICATIONS

Y. Oshima et al., "Preparation of Freestanding GaN Wafers by Hydride Vapor Phase Epitaxy with Void-Assisted Separation", Jpn. J. Appl. Phys., vol. 42, Part 2, No. 1A/B, Jan. 15, 2003, pp. L1-L3.

T. Zheleva et al., "Pendeo-Epitaxy—A New Approach for Lateral Growth of Gallium Nitride Structures", MRS Internet J. Nitride Semicond. Res. 4S1, G3.38 (1999), 6 pages.

K. Motoki et al., "Preparation of Large Freestanding GaN Substrates by Hydride Vapor Phase Epitaxy Using GaAs as a Starting Substrate", Jpn. J. Appl. Phys., vol. 40, Part 2, No. 2B, Feb. 15, 2001, pp. L140-L143.

* cited by examiner

III-V GROUP NITRIDE SYSTEM SEMICONDUCTOR SUBSTRATE

The present application is based on Japanese patent application No. 2003-368828, the entire contents of which are incorporated herein by reference.

BACKGROUND OF THE INVENTION

1. Field of the Invention

This invention relates to a III–V group nitride system semiconductor substrate.

2. Description of the Related Art

Nitride system semiconductor materials such as gallium nitride (GaN), indium gallium nitride (InGaN) and gallium aluminum nitride (GaAlN) have a sufficiently wide bandgap and are of direct transition type in inter-band transition. Therefore, they are a great deal researched to be applied to short-wavelength light emitting device. Further, they have a high saturation drift velocity of electron and can use two-dimensional carrier gases in hetero junction. Therefore, they are also expected to be applied to electronic device.

With silicon (Si) or gallium arsenide (GaAs) which is already in popular use, an epitaxial growth layer of silicon (Si) or gallium arsenide (GaAs) to compose a device is homo-epitaxially grown on Si substrate or GaAs substrate of same kind of material. In homo epitaxial growth on homo-substrate, the crystal growth proceeds in step flow mode from the initial stage. Therefore, it is easy to obtain flat epitaxially grown surface while generating little crystal defect. In the case that a ternary or more compound crystal layer such as AlGaInP is grown on GaAs substrate with a lattice constant close to that layer, the surface morphology of epitaxial layer is likely to be roughened. However, by tilting the planar orientation of underlying substrate from low index surface as reference intentionally to a specific direction, which is generally called "off-orientation", it becomes possible to obtain flat epitaxially grown surface while generating little crystal defect.

On the other hand, it is difficult to grow bulk crystal of nitride system semiconductor and, recently, GaN self-standing substrate with a level for practical use is just developed. At present, a widely used substrate for epitaxial growth GaN is sapphire. The process of growing a nitride system semiconductor epitaxial layer to compose a device is generally conducted as follows. At first, GaN is hetero-epitaxially grown on single-crystal sapphire by using vapor-phase growth such as MOVPE (metal organic vapor phase epitaxy), MBE (molecular beam epitaxy) and HVPE (hydride vapor phase epitaxy). Then, the nitride system semiconductor epitaxial layer is grown on GaN sequentially or in another growth vessel.

Since the sapphire substrate has a lattice constant different from that of GaN, single-crystal film of GaN cannot be obtained by growing GaN directly at a high temperature on the sapphire substrate. Thus, a method is invented that AlN or GaN buffer layer is in advance grown on the sapphire substrate at a low temperature of 500° C. or so, thereby reducing the lattice strain, and then GaN is grown on the buffer layer (e.g., Japanese patent application laid-open No. 4-297023). With such a low temperature growth buffer layer, it becomes possible to obtain single-crystal epitaxially grown GaN. However, even in this method, the lattice mismatch between substrate and grown crystal is not eliminated and, at the initial step of growth, the crystal growth proceeds in three-dimensional island growth mode (Volmer-Waber growth mode), not in step flow mode (Stranski-krastanov growth mode) aforementioned. Therefore, GaN thus obtained has a dislocation density as many as $10^9$ to $10^{10}$ cm$^{-2}$. Such a defect causes a problem in fabricating GaN system device, especially LD or ultraviolet emission LED.

In recent years, ELO (e.g., Appl. Phys. Lett. 71 (18) 2638 (1997)), FIELO (e.g., Jpan. J. Appl. Phys. 38, L184 (1999)) and pendeoepitaxy (e.g., MRS Internet J. Nitride Semicond. Res. 4S1, G3.38 (1999)) are reported that are methods for reducing the defect density generated due to lattice mismatch between sapphire and GaN. In these methods, a SiO$_2$ patterning mask is formed on GaN grown on sapphire substrate, and then GaN is selectively grown from the window of mask. Thereby, the propagation of dislocation from underlying crystal can be suppressed. Due to such a growth method, the dislocation density in GaN can be significantly reduced to a level of $10^7$ cm$^{-2}$ or so. For example, Japanese patent application lain-open No. 10-312971 discloses such a method.

Further, various methods of making a self-standing GaN substrate are suggested that a thick GaN layer with reduced dislocation density is epitaxially grown on hetero-substrate such as sapphire and then the grown GaN layer is peeled from the underlying substrate (e.g., Japanese patent application laid-open No. 2000-22212). For example, Japanese patent application laid-open No. 11-251253 discloses a method of making a self-standing GaN substrate that a GaN layer is grown on sapphire substrate by ELO and then the sapphire substrate is removed by etching. Other than this, VAS (Void-Assisted Separation: e.g., Y. Oshida et al., Jpn. J. Appl. Phys. Vol. 42 (2003) pp. L1–L3, Japanese patent application laid-open No. 2003-178984) and DEEP (Dislocation Elimination by the Epi-growth with inverted-Pyramidal pits: e.g., K. Motoki et al., Jpn. J. Appl. Phys. Vol. 40 (2001) pp. L140–L143, Japanese patent application laid-open No. 2003-165799) are known. VAS is conducted such that GaN is grown through TiN thin film with mesh structure on substrate such as sapphire while providing voids at the interface of underlying substrate and GaN layer, thereby enabling simultaneously the pealing and the reduction of dislocation of GaN substrate. DEEP is conducted such that GaN is grown on GaAs substrate, which is removable by etching, by using SiN patterning mask while intentionally forming pits surrounded by facets on the surface of crystal, accumulating dislocations at the bottom of pits to allow regions other than pits to have low dislocation density.

However, the conventional methods of making GaN substrate have next problems.

As described, GaN epi-layer to compose a device is once at least hetero-epitaxially grown on hetero-substrate such as sapphire and GaAs with a considerably different lattice constant. This is common both in using GaN template and in using self-standing substrate.

When GaN is grown on a substrate with considerably different lattice constant, a number of small GaN nuclei are generated and then, according as they are grown, neighboring crystal nuclei are coalesced and finally provides continuous film. Thus, the crystal growth proceeds in so-called three-dimensional island growth mode. There is no problem when the growth orientation of individual crystal nucleus is just aligned and the distance between nuclei is just matched with an integral multiple of lattice constant of GaN. However, in general, there occurs a phenomenon that the crystal nucleus is tilted or twisted to the surface of underlying substrate, and the planarization forcedly proceeds while generating crystal defect such as dislocation at the interface of coalesced nuclei. Therefore, GaN grown layer is, though it appears as homogeneous crystal, exactly composed of a number of columnar crystal grains (sub-grains), and a number of defects are contained at the boundary of grains. This is the reason why, in case of GaN, only substrate with a dislocation density as many as $10^5$ to $10^9$ cm$^{-2}$ can be obtained. In case of Si or GaAs, single-crystal substrate with no dislocation or with a dislocation density of less than $1 \times 10^3$ cm$^{-2}$ can be easily obtained. Thus, in case of GaN, although the crystal orientation of individual grain is roughly aligned, it has a considerable variation. Although the number of nuclei generated at the initial stage of crystal growth can be significantly reduced by using the aforementioned ELO, there occurs a strain in grown GaN due to a difference between region with mask for selective growth and region without the mask and, thereby, the crystal axis is tilted. As a result, GaN crystal thus obtained still has a variation in grain crystal orientation.

This situation will be explained below with reference to drawings.

Figure 1:
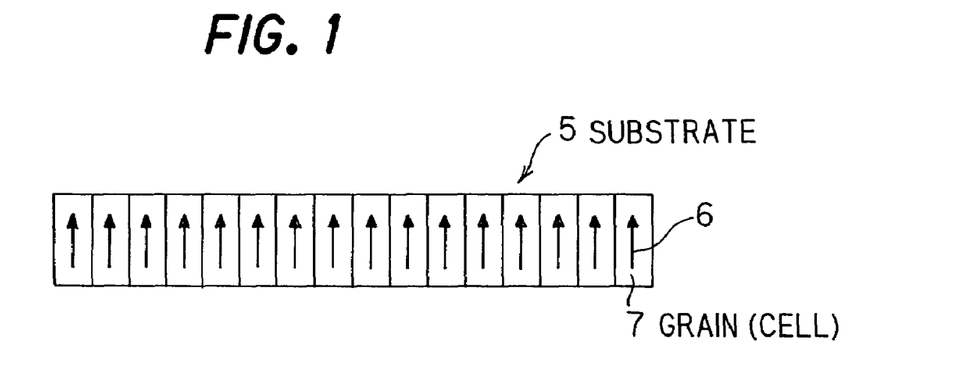
FIG. 1 is an illustrative cross sectional view showing the inclination of crystal axis in an ideal substrate 5 with no variation in crystal orientation.

FIG. 1 is an illustrative cross sectional view showing the inclination of crystal axis in an ideal substrate 5 with no variation in crystal orientation. Arrows 6 in FIG. 1 are vectors indicating the direction and amount in inclination of crystal axis. A cell including one arrow corresponds to a grain 7. In case of the substrate 5 with c-face on its surface, arrow 6 represents the direction and amount in inclination of c-axis. That, as shown in FIG. 1, there is no inclination of crystal axis in plane of substrate means that no boundary between grains 7, 7 exists in fact. It is presumed that Si substrate has such a structure.

Figure 2:
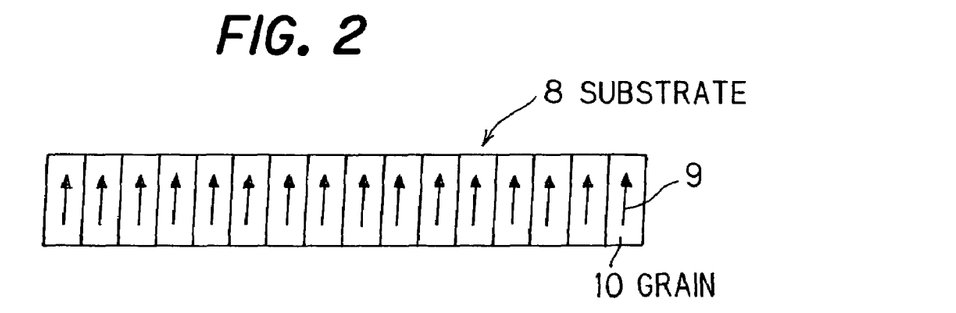
FIG. 2 is an illustrative cross sectional view showing the inclination of crystal axis in an ideal substrate 8 with "off-orientation"

FIG. 2 is an illustrative cross sectional view showing the inclination of crystal axis in an ideal substrate 8 with "off-orientation". Arrows 9 indicate the direction and amount in inclination of crystal axis of individual grain 10.

Figure 3:
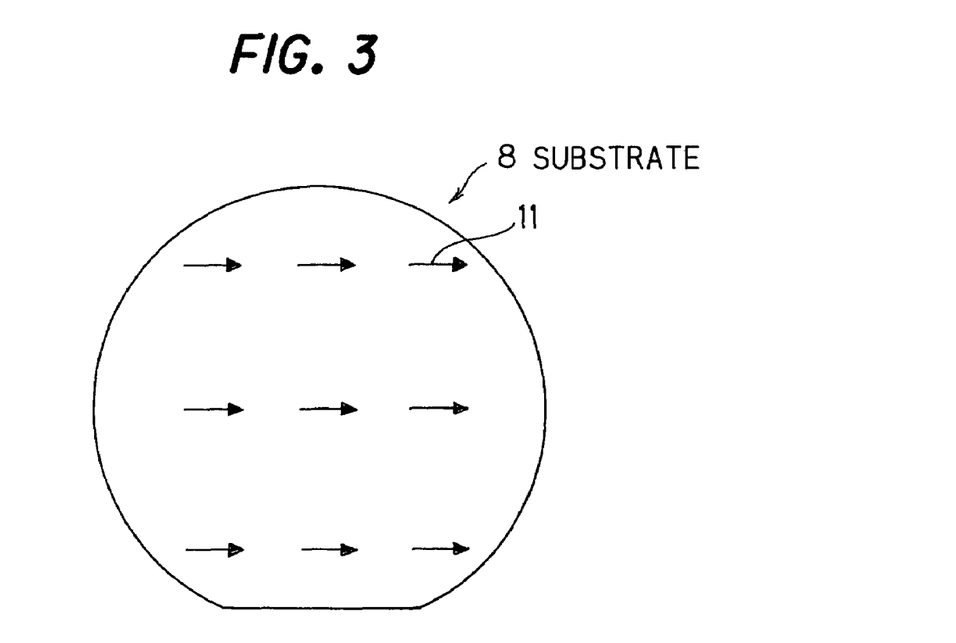
FIG. 3 is an illustrative top view showing the in-plane distribution of inclination of crystal axis in the ideal substrate 8 with "off" orientated while viewing the arrows 9 from the surface side of substrate 8.

FIG. 3 is an illustrative top view showing the in-plane distribution of inclination of crystal axis in the ideal substrate 8 with "off" orientated while viewing the arrows 9 from the surface side of substrate 8. Arrows 11 indicate the inclination direction of crystal axis. If there is an ingot with crystal axis aligned, the substrate with a distribution of crystal axis as shown in FIGS. 2 and 3 can be easily made by cutting diagonally and polishing it. It is presumed that "off" substrate generally used for GaAs or sapphire substrate has such a distribution of crystal axis.

Figure 4:
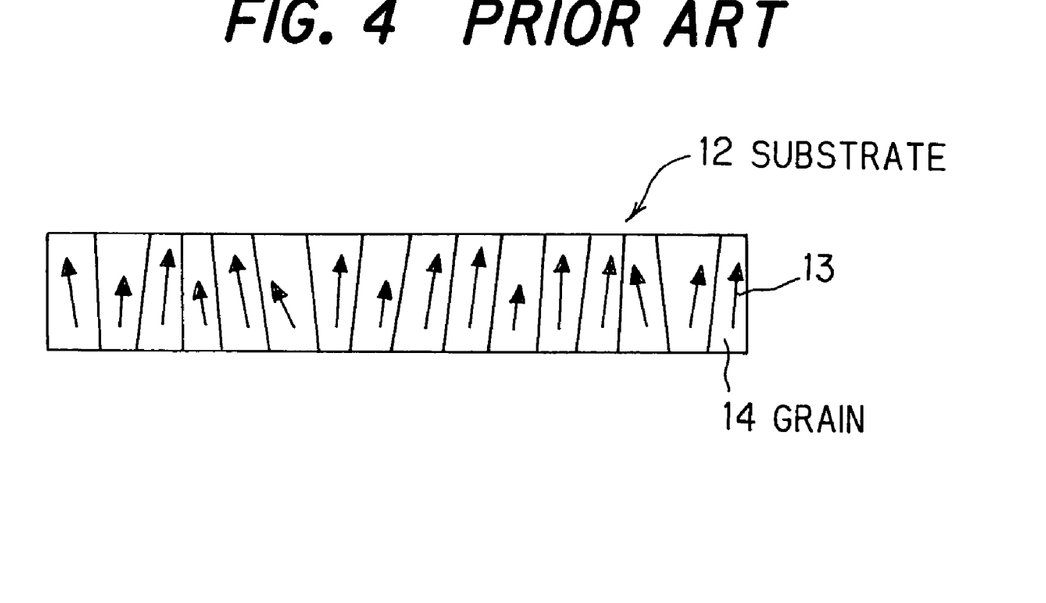
FIG. 4 is an illustrative cross sectional view showing the inclination of crystal axis in a conventional GaN substrate 12.

FIG. 4 is an illustrative cross sectional view showing the inclination of crystal axis in a conventional GaN substrate 12. Arrows 13 are vectors indicating the direction and amount in inclination of crystal axis.

Figure 5:
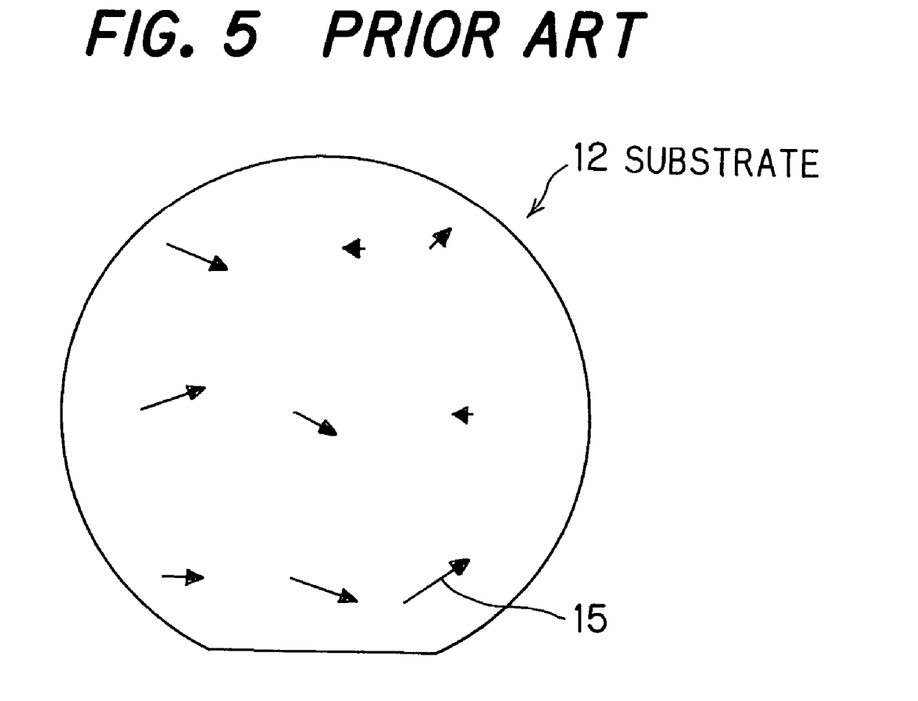
FIG. 5 is an illustrative top view showing the in-plane distribution of inclination of crystal axis in the substrate 12.

FIG. 5 is an illustrative top view showing the in-plane distribution of inclination of crystal axis in the substrate 12. Arrows 15 indicate the inclination direction of crystal axis. As described earlier, in crystal growth of nitride system, due to the three-dimensional island growth where hetero-epitaxial growth is forced, there are a number of grains 14 in the crystal substrate. These grains 14 are aligned along nearly equal crystal axes and the entire substrate is formed as close as single crystal. However, the crystal axis of each grain 14 is inclined by tilting or twisting and the crystal axes in plane of substrate have a variation. Especially in the substrate 12 with no "off-orientation", the inclination direction of axes of grains 14 has to be varied in disorder.

Thus, in the case of having a variation in the direction and amount of inclination in crystal axes in plane of substrate, a flat epi-surface cannot be obtained even in homo-epitaxial growth when GaN is epitaxially grown on such a substrate.

In general, crystal growth rate has anisotropy to crystal orientation. Therefore, if the inclination direction of crystal axes is different or the amount of inclination is significantly varied on the surface of substrate, there occurs a difference in crystal growth rate by location even in plane of substrate. Thus, film with uniform thickness cannot be obtained. Further, step bunching is generated locally and it causes a roughness in morphology of epi-surface. This is a problem specific to nitride system semiconductor material and not common to conventional semiconductor materials such as Si and GaAS.

The roughness in morphology of epi-surface is amplified according as the thickness of epi-layer increases. Therefore, although the roughness in morphology is slight at the stage of having only one thin GaN layer on sapphire substrate, the roughness of surface is amplified when an epi-layer is further grown using that layer as template. This causes a reduction in product yield of device fabrication process and in characteristics of device itself.

In case of GaN self-standing substrate, based on the same reason, the surface of GaN generally has unevenness such as big undulation or hillock when thick GaN layer is grown on hetero-substrate. When using it as GaN substrate, its surface is mirror-finished by polishing. Thus, it appears to have a sufficiently flat surface. However, since the crystal itself is composed of grains with tilting or twisting as mentioned earlier, regardless of polishing, the roughness in surface morphology will occur due to the underlying grains when GaN layer is further epitaxially grown on the polished surface of GaN substrate.

In the conventional methods, there is suggested a thought that the variation of planar orientation in GaN single crystal substrate is defined. For example, Japanese patent application laid-open No. 2000-22212 discloses a GaN substrate that the inclination and variation of planar orientation is defined. However, it aims at eliminating influences by the warping of substrate. In other words, the conventional methods do not have an idea that the inclination direction is to be aligned in plane of substrate. Thus, they offer no solution to the problem, i.e., roughness in surface morphology. For example, this is proved with reference to FIG. 15 of No. 2000-22212.

SUMMARY OF THE INVENTION

It is an object of the invention to provide a III–V group nitride system semiconductor substrate that can prevent roughness in surface morphology of epitaxial grown layer.

According to first aspect of the invention, a III–V group nitride system semiconductor substrate comprises:

III–V group nitride system single crystal;

wherein said III–V group nitride system semiconductor substrate has a flat surface and satisfies the relationship of $\theta > \alpha$, where $\theta$ [deg] is given as an average in angles of the substrate surface to low index surfaces closest to the substrate surface measured at a plurality of arbitrary points in plane of the substrate, and a variation range of said measured angles to $\theta$ is represented by $\pm \alpha$ [deg].

According to second aspect of the invention, a III–V group nitride system semiconductor substrate comprises:

III–V group nitride system single crystal;

wherein said III–V group nitride system semiconductor substrate has a flat surface and a low index surface closest to the substrate surface is inclined to the substrate surface at an arbitrary point in plane of the substrate, the inclination angle has a variation in plane of the substrate, and the inclination direction at an arbitrary point in plane of the substrate is nearly constant.

According to third aspect of the invention, a III–V group nitride system semiconductor substrate comprises:
III–V group nitride system single crystal;
wherein
said III–V group nitride system semiconductor substrate has a flat surface and the normal vector of a low index surface closest to the substrate surface is inclined to a normal line to the substrate surface at an arbitrary point in plane of the substrate, and the direction distribution range of vector projected onto the substrate surface of said normal vector at an arbitrary point in plane of the substrate is less than 180 [deg].

According to fourth aspect of the invention, a III–V group nitride system semiconductor substrate comprises:
III–V group nitride system single crystal;
wherein
said III–V group nitride system semiconductor substrate has a flat surface and satisfies the relationship of $\theta > \alpha$, where $\theta$ [deg] is given as an average in angles of the substrate surface to low index surfaces closest to the substrate surface measured at a plurality of arbitrary points in plane of the substrate, and a variation range of said measured angles to $\theta$ is represented by $\pm \alpha$ [deg], and the inclination direction at an arbitrary point in plane of the substrate is nearly constant.

According to fifth aspect of the invention, a III–V group nitride system semiconductor substrate comprises:
III–V group nitride system single crystal;
wherein
said III–V group nitride system semiconductor substrate has a flat surface and satisfies the relationship of $\theta > \alpha$, where $\theta$ [deg] is given as an average in angles of the substrate surface to low index surfaces closest to the substrate surface measured at a plurality of arbitrary points in plane of the substrate, and a variation range of said measured angles to $\theta$ is represented by $\pm \alpha$ [deg], and the direction distribution range of vector projected onto the substrate surface of the normal vector of low index surfaces closest to the substrate surface at a plurality of arbitrary points in plane of the substrate is less than 180 [deg].

With III–V group nitride system semiconductor substrate of this invention, even when there is a variation in inclination of crystal axis as a problem specific to III–V group nitride system semiconductor substrate, surface roughness such as hillock or terrace, which affects the device fabrication, in nitride system crystal layer epitaxially grown on the substrate can be prevented.

As a result, III–V group nitride system semiconductor substrate of this invention allows light emitting device or electronic device to have properties as designed initially. Furthermore, the product yield in epitaxial growth process or device fabrication process can be enhanced thereby.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

The inventor researches a variation in the amount and direction of inclination in crystal axis of grain composing a III–V group system semiconductor substrate, and the relationship between that variation and a surface morphology of epitaxial layer grown on that substrate. As a result, they find that the relationship of $\theta > \alpha$ is needed to obtain the flatness of epi-surface required to device fabrication, where $\theta$ [deg] is an average in inclination amount of crystal axis of grains ($\theta$ [deg] is given as an average in angles of substrate surface to low index surfaces closest to substrate surface measured at a plurality of arbitrary points in plane of substrate), and the variation range of that inclination to $\theta$ is represented by $\pm \alpha$. Furthermore, they find that it is important that all of crystal axes have a nearly constant inclination direction. Nearly constant inclination direction means that there exists in plane no grain having a crystal axis inclination that the direction of vector projected onto substrate surface differs more than 180 [deg]. If the relationship of $\theta > \alpha$ is inverted, i.e., $\theta \leq \alpha$ is established, then a grain is generated that the direction of vector projected onto substrate surface to indicate the inclination direction of crystal axis is inverted in plane of substrate. This causes a surface roughness in epitaxial growth layer. When $\theta < 90$ and $\theta > \alpha$ are satisfied, it is not generated that the direction of vector projected onto substrate surface to indicate the inclination direction of crystal axis is inverted in plane of substrate.

It is desirable that $\theta$ has a value of 10 or less [deg]. If $\theta$ exceeds 10 [deg], then hillock is likely to occur on the epitaxial surface.

It is desirable that $\alpha$ has an absolute value of 1.0 or less [deg]. If $\alpha$ exceeds $\pm 1.0$ [deg], then rough morphology due to a facetting phenomenon is likely to occur on the epitaxial surface even if all of crystal axes have a nearly constant inclination direction.

Since $\theta$ and $\alpha$ should be zero in ideal perfect crystal, they do not have an optimum lower limit.

It is desirable that, from the viewpoint of easiness in device fabrication, III–V group nitride system semiconductor substrate of the invention is a substrate having hexagonal system C-face, especially III group face being chemically, mechanically and thermally stable, on its surface. However, its surface may be A-face, R-face etc. other than C-face. Further, it may be of cubic crystal.

III–V group nitride system semiconductor substrate of the invention may be a so-called template, which is nitride system semiconductor crystal epitaxially grown on hetero-substrate, or a self-standing substrate only of nitride system semiconductor crystal, if the surface of substrate is of nitride system semiconductor crystal.

In the invention, "self-standing" substrate means a substrate that can keep its own shape and has such a strength as no problem occurs in handling. In order to have such a strength, it is preferable that the self-standing substrate has a thickness of 200 μm or more.

III–V group nitride system semiconductors of the invention are represented by: $In_xGa_yAl_{1-x-y}N$ ($0 \leq x \leq 1$, $0 \leq y \leq 1$, $0 \leq x+y \leq 1$). Of these, GaN and AlGaN are preferable since they satisfy properties such as strength and fabrication stability required to substrate material.

The inclination of crystal axis in plane of substrate can be evaluated using a value obtained by X-ray diffraction measurement.

It is desirable that GaN substrate of the invention is grown by MOVPE or MBE for template and by HVPE for self-standing substrate. The reason why HVPE is used for self-standing substrate is that its crystal growth rate is high and suitable for substrate fabrication.

It is desirable that GaN system self-standing substrate has a surface mirror-finished by polishing. In general, as-grown GaN system epi-surface has a lot of large unevenness such as hillock or microscopic unevenness presumed to occur due to step bunching. These cause not only nonuniformity in morphology, film thickness, composition etc. of epi-layer grown thereon but also reduction in processing accuracy of photolithography in device fabrication process. Therefore, the substrate desirably has a flat mirror-finished surface.

It is desirable that GaN system self-standing substrate has a back surface flattened by polishing. In general, GaN system self-standing substrate is obtained by peeling it from an underlying hetero-substrate after being hetero-epitaxially grown on the underlying hetero-substrate. Therefore, the back surface of self-standing substrate peeled frequently has a rough surface like a frosted glass or part of underlying substrate attached thereto. Further, it frequently is not flat due to warping of substrate. These cause nonuniformity in substrate temperature distribution during the epitaxial growth process. As a result, the uniformity and reproducibility of epi-layer will degrade.

EXAMPLE 1

A plurality of GaN templates are fabricated such that 4 μm Si-doped GaN layer is grown through 20 nm GaN buffer layer on sapphire C-face substrate with a diameter of 2 inches φ by MOVPE. Growth pressure is atmospheric pressure, substrate temperature in buffer layer growth is 600° C., and substrate temperature in epi-layer growth is 1100° C. TMG is used for III group raw material, $NH_3$ for V group raw material, and monosilane for dopant. Carrier gas is mixed gas of hydrogen and nitrogen. Crystal growth rate is 4 μm/h. Carrier concentration of epi-layer is $2 \times 10^{18}$ $cm^{-3}$.

In all of the GaN templates, the inclination of C-axis in GaN single crystal (aforementioned Si-doped GaN layer) located on the surface of GaN template is measured in plane. The measurement is conducted such that the amount and direction of C-axis inclination is determined based on the positional relationship between shift amount in X-ray diffraction peak position measured while rotating the sample and orientation flat (OF) of substrate. In the measurement, 25 points in total are measured at intervals of 7 mm in the parallel and vertical directions from the center of GaN template as base point. Then, vector average of C-axis inclination measured at 25 points is calculated, its average angle is determined θ [deg] and the difference of θ and an inclination value measured at point farthest from θ is determined α [deg].

Thus, GaN templates are obtained that its GaN single crystal surface has θ distribution of 1 to 15 [deg] and α distribution of 0.2 to 2 [deg].

Next, on the GaN template thus obtained, 6 μm Si-doped GaN layer is homo-epitaxially grown by MOVPE. It is researched what correlation exists between its surface morphology and the direction, amount and variation in C-axis inclination of GaN single crystal located on the surface of GaN templates. The growth conditions of epi-layer are the same as those of GaN in GaN template. The evaluation of surface morphology is conducted using Nomarski microscope and surface profiler (DEKTAK). When apparent hillock or unevenness is recognized using the microscope of 400 magnifications or Ra exceeds 500 Å in scanning a range of 500 μm by surface profiler, the surface is determined rough.

Figure 9:
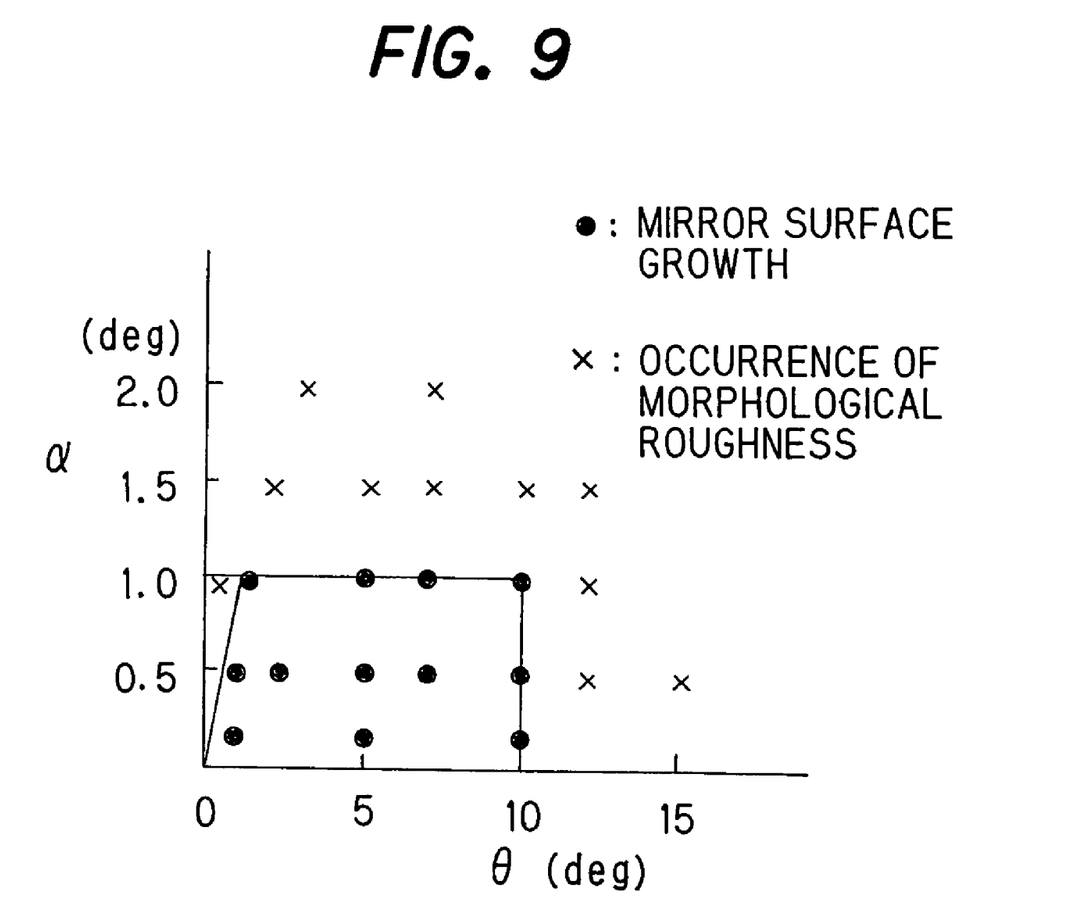
FIG. 9 is a graph showing the result of researching the amount ($\theta$) of crystal axis inclination in GaN single crystal located on the surface of GaN template, its variation ($\alpha$) and a change in surface morphology of GaN layer epitaxially grown on the GaN template corresponding to $\theta$ and $\alpha$.

FIG. 9 is a graph showing the result of researching the amount (θ) of crystal axis inclination in GaN single crystal located on the surface of GaN template, its variation (α) and a change in surface morphology of GaN layer epitaxially grown on the GaN template corresponding to θ and α.

As shown in FIG. 9, GaN single crystal located on the underlying substrate to allow GaN epitaxial layer to have flat surface needs to satisfy θ>α at arbitrary point in plane of that substrate, further to satisfy θ<10 [deg] and α<1.0 [deg].

EXAMPLE 2

Ten GaN templates are fabricated such that 1.5 μm Si-doped GaN layer is grown through 20 nm GaN buffer layer on sapphire C-face substrate with a diameter of 2 inches φ by MOVPE. The sapphire substrate is inclined from C-face by 0.3 [deg] in the direction of M-axis. Processing accuracy of "off" is ±0.05 [deg]. Growth pressure is atmospheric pressure, substrate temperature in buffer layer growth is 600° C., and substrate temperature in epi-layer growth is 1100° C. TMG is used for III group raw material, $NH_3$ for V group raw material, and monosilane for dopant. Carrier gas is mixed gas of hydrogen and nitrogen. Crystal growth rate is 4 μm/h. Carrier concentration of epi-layer is $2 \times 10^{18}$ $cm^{-3}$.

In all of the GaN templates, the inclination of C-axis in GaN single crystal (aforementioned Si-doped GaN layer) located on the surface of GaN template is measured in plane. The measurement is conducted such that the amount and direction of C-axis inclination is determined based on the positional relationship between shift amount in X-ray diffraction peak position measured while rotating the sample and orientation flat (OF) of substrate. In the measurement, 25 points in total are measured at intervals of 7 mm in the parallel and vertical directions from the center of GaN template as base point. Then, vector average of C-axis inclination measured at 25 points is calculated, its average angle is determined θ [deg] and the difference of θ and an inclination value measured at point farthest from θ is determined α[deg].

All of C-axes of GaN single crystal located on the ten GaN templates are tilted 0.3 to 0.5 [deg] in the direction of M-axis of sapphire substrate due to the "off" direction of sapphire substrate. α value is 0.15 [deg] at the maximum of ten substrates. In these GaN templates, it is previously researched how much degree at the maximum in plane of C-face the direction of vector to indicate the C-axis inclination projected onto reference face on the substrate surface varies from the projected direction of vector with average inclination.

Figure 6:
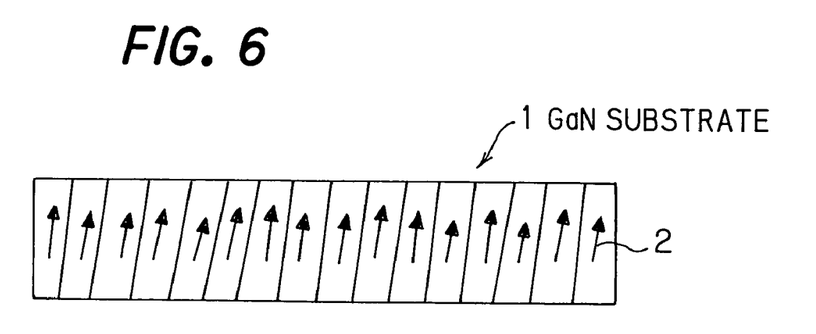
FIG. 6 is an illustrative cross sectional view showing the C-axis inclination of GaN single crystal located on the surface of GaN substrate (or self-standing GaN substrate) of one embodiment according to the invention.
Figure 7:
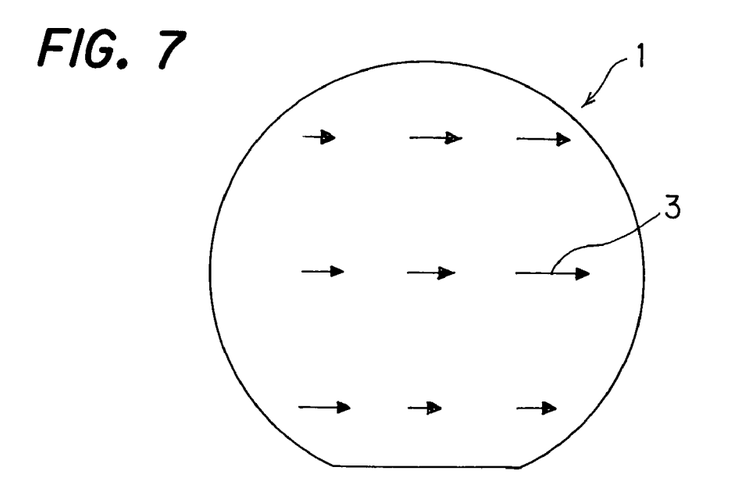
FIG. 7 is an illustrative top view showing the distribution of C-axis inclination direction projected onto the surface of GaN substrate of one embodiment according to the invention.

FIG. 6 is an illustrative cross sectional view showing the C-axis inclination of GaN single crystal located on the surface of GaN substrate (GaN template obtained as above) of one embodiment according to the invention. FIG. 7 is an illustrative top view showing the distribution of C-axis inclination direction projected onto the surface of GaN substrate of one embodiment according to the invention. 1 is GaN substrate, 2 is an arrow to indicate the C-axis inclination, and 3 is an arrow to indicate the projected C-axis inclination. The C-axis inclination direction projected onto the surface of substrate varies due to the warping of substrate. However, the variation is 0.1 or less [deg] and the inclination direction can be seen as nearly equal.

Next, on the GaN template thus obtained, 6 μm Si-doped GaN layer is homo-epitaxially grown by MOVPE. Then, the surface morphology is evaluated. The growth conditions of epi-layer are the same as those of GaN in GaN template. The evaluation of surface morphology is conducted using Nomarski microscope and surface profiler (DEKTAK). No unevenness is recognized in observance using the microscope of 400 magnifications except for hillock or pit assumed apparently due to foreign substances attached. Ra is 34 to 87 Å in scanning a range of 500 μm by surface profiler and, therefore, it is confirmed that flat epitaxial growth surface is obtained with good reproducibility.

EXAMPLE 3

300 μm undoped GaN layer is grown using TMG and $NH_3$ as raw material on commercially available 2-inch diameter single crystal sapphire C-face substrate with "off" of 0.2±0.05 [deg] in the direction of M-axis by MOVPE. 20 nm metal Ti film is deposited on the GaN epi-substrate. Then, it is heat-treated at 1050° C. for 20 min. in $H_2$ flow including 20% $NH_3$ in electric furnace. Thereby, metal Ti film is changed to mesh-like TiN film and a number of voids are formed in the GaN layer. Then, 550 μm GaN is grown thereon in HVPE vessel. In the growth, $NH_3$ and GaCl are used as raw material and $N_2$ is used as carrier gas. The growth conditions are atmospheric pressure and substrate temperature of 1040° C. GaN layer is by itself peeled from the sapphire substrate at the void layer in the cooling process after the growth. Thus, a self-standing GaN substrate is obtained. Using this method, ten self-standing GaN substrates are fabricated under the same conditions.

All self-standing GaN substrates thus obtained have mirrored surface but they have hexagonal hillock recognizable by eyes. Further, the back surface of self-standing GaN substrates has roughness like frosted glass and metal Ga attached partially. So, the front and back surfaces of self-standing GaN substrates are mirror-finished by polishing using diamond slurry. As a result, the self-standing GaN substrates become clear and transparent and no unevenness is recognized on the surface thereof in observation of eyes and microscope. When the surface roughness of polished self-standing GaN substrates is measured using surface profiler, it is confirmed that Ra is less than 10 nm in scanning a range of 500 μm on the entire surface in all the self-standing GaN substrates.

In the ten self-standing GaN substrates thus polished, the inclination of C-axis is measured in plane. The measurement is conducted as described in Example 2. In the measurement, 25 points in total are measured at intervals of 7 mm in the parallel and vertical directions from the center of GaN template as base point. Then, vector average of C-axis inclination measured at 25 points is calculated, its average angle is determined θ [deg] and the difference of θ and an inclination value measured at point farthest from θ is determined α.

All C-axes of the ten self-standing GaN substrates are tilted 0.3 to 1.1 [deg] due to the "off" direction of sapphire substrate. α value is 0.75 [deg] at the maximum of ten self-standing GaN substrates. The ten self-standing GaN substrates all satisfy θ>α.

Figure 8:
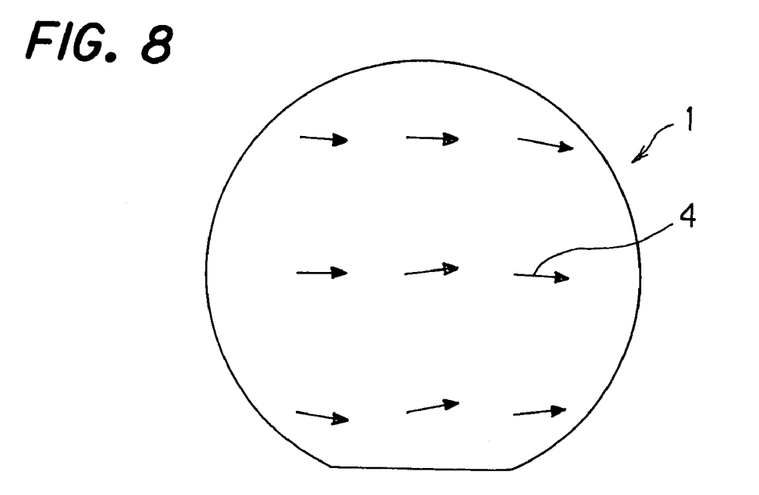
FIG. 8 is an illustrative top view showing the distribution of C-axis inclination direction projected onto the surface of GaN substrate of one embodiment according to the invention.

FIG. 6 is also an illustrative cross sectional view showing the C-axis inclination of self-standing GaN substrate of one embodiment according to the invention. FIG. 8 is an illustrative top view showing the distribution of C-axis inclination direction projected onto the surface of GaN substrate of one embodiment according to the invention. 1 is GaN substrate, 2 is an arrow to indicate the C-axis inclination, and 4 is an arrow to indicate the projected C-axis inclination. As compared to the GaN template obtained in Example 2 (FIG. 7), the C-axis inclination direction projected onto the surface of substrate varies slightly (FIG. 8). However, even in substrate with biggest variation, the C-axis inclination direction projected onto the surface of substrate varies within ±0.6 [deg].

Next, on the ten self-standing GaN substrates thus obtained, 4 μm Si-doped GaN layer is homo-epitaxially grown by MOVPE. Then, the surface morphology is evaluated. The growth conditions of epi-layer are the same as those of GaN in Example 1. The evaluation of surface morphology is conducted using Nomarski microscope and surface profiler (DEKTAK). No unevenness is recognized in observance using the microscope of 400 magnifications except for hillock or pit assumed apparently due to foreign substances attached. Ra is 44 to 98 Å in scanning a range of 500 μm by surface profiler and, therefore, it is confirmed that flat epitaxial growth surface is obtained with good reproducibility. Further, when the epi-substrates are tested by X-ray diffraction measurement, FWHM of GaN (0002) face diffraction is less than 100 [arcsec] at any positions in plane for all the epi-substrates, and it is confirmed that good and uniform crystal quality is obtained.

In the above Examples 1 to 3, GaN crystal may be grown by MBE, LPE (liquid phase epitaxy), sublimation etc. Although, in the above Examples 1 to 3, sapphire substrate is used as underlying substrate in fabricating GaN template or self-standing GaN substrate, all the GaN system epi-layer growth substrates conventionally reported such as GaAs, Si, $ZrB_2$ and ZnO may be used.

Although in Example 3 the self-standing GaN substrate is used, self-standing AlGaN substrate may be also used.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A III–V group nitride system semiconductor substrate, comprising:
   III–V group nitride system single crystal;
   wherein said III–V group nitride system semiconductor substrate has a flat surface and satisfies the relationship of θ>α, where θ [deg] is given as an average in angles of the substrate surface to low index surfaces closest to the substrate surface measured at a plurality of arbitrary points in plane of the substrate, and α [deg] represents a difference of θ and an inclination value measured at a point farthest from θ.

2. The III–V group nitride system semiconductor substrate according to claim 1, wherein; the inclination direction at an arbitrary point in plane of the substrate is nearly constant.

3. The III–V group nitride system semiconductor substrate according to claim 1, wherein; the direction distribution range of vector projected onto the substrate surface of the normal vector of low index surface closest to the substrate at a plurality of arbitrary point in plane of the substrate is less than 180 [deg].

4. The III–V group nitride system semiconductor substrate, according to claim 1, wherein:
said III–V group nitride system single crystal is hetero-epitaxially grown on hetero-substrate.

5. The III–V group nitride system semiconductor substrate according to claim 1, wherein:
said III–V group nitride system single crystal composes a self-standing substrate.

6. The III–V group nitride system semiconductor substrate according to claim 1, wherein:
said III–V group nitride system single crystal is of a hexagonal system.

7. The III–V group nitride system semiconductor substrate according to claim 1, wherein:
said III–V group nitride system single crystal is of a hexagonal system and said low index surface closest to the substrate surface is C-face.

8. The III–V group nitride system semiconductor substrate according to claim 1, wherein:
said III–V group nitride system single crystal is of a hexagonal system and said low index surface closest to the substrate surface is A-face, M-face or R-face.

9. The III–V group nitride system semiconductor substrate according to claim 1, wherein:
said substrate surface is mirror-finished by polishing.

10. The III–V group nitride system semiconductor substrate according to claim 1, wherein:
said θ is 10 or less [deg].

11. The III–V group nitride system semiconductor substrate according to claim 1, wherein:
said α is 1.0 or less [deg].

12. The III–V group nitride system semiconductor substrate according to claim 1, wherein:
said θ is 10 or less and said α is 1.0 or less [deg].

13. The III–V group nitride system semiconductor substrate according to claim 1, wherein:
said low index surfaces closest to the substrate surface are C-face and the inclination direction of said low index surfaces to the substrate surface is in A-axis direction.

14. The III–V group nitride system semiconductor substrate according to claim 1, wherein:
said low index surfaces closest to the substrate surface are C-face and the inclination direction of said low index surfaces to the substrate surface is in M-axis direction.

* * * * *